(12) United States Patent
Bernt

(10) Patent No.: US 11,875,996 B2
(45) Date of Patent: Jan. 16, 2024

(54) METHODS FOR ELECTROCHEMICAL DEPOSITION OF ISOLATED SEED LAYER AREAS

(71) Applicant: Applied Materials, Inc., Santa Clara, CA (US)

(72) Inventor: Marvin Louis Bernt, Whitefish, MT (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 7 days.

(21) Appl. No.: 17/482,562

(22) Filed: Sep. 23, 2021

(65) Prior Publication Data

US 2023/0086742 A1    Mar. 23, 2023

(51) Int. Cl.
| | | |
|---|---|---|
| H01L 21/768 | (2006.01) | |
| H01L 23/522 | (2006.01) | |
| H01L 23/00 | (2006.01) | |
| H01L 23/31 | (2006.01) | |
| H01L 23/495 | (2006.01) | |
| H01L 23/528 | (2006.01) | |
| H01L 23/532 | (2006.01) | |
| H01L 23/367 | (2006.01) | |
| H01L 25/065 | (2023.01) | |
| H01L 21/288 | (2006.01) | |

(52) U.S. Cl.
CPC .... *H01L 21/2885* (2013.01); *H01L 21/76846* (2013.01); *H01L 21/76873* (2013.01); *H01L 21/76879* (2013.01); *H01L 23/53238* (2013.01)

(58) Field of Classification Search
CPC .......... H01L 21/2885; H01L 21/76846; H01L 21/76873; H01L 21/76879; H01L 23/53238

See application file for complete search history.

(56) References Cited

U.S. PATENT DOCUMENTS

| | | | |
|---|---|---|---|
| 6,881,664 B2 * | 4/2005 | Catabay ............ | H01L 21/32115 438/692 |
| 9,842,949 B2 | 12/2017 | Moslehi et al. | |
| 10,693,041 B2 | 6/2020 | Cich et al. | |
| 2004/0038052 A1 * | 2/2004 | Collins ............. | H01L 21/76877 257/E21.585 |
| 2008/0029400 A1 * | 2/2008 | Mazur ................... | C23C 28/341 205/136 |
| 2015/0171230 A1 | 6/2015 | Kapur et al. | |
| 2019/0189507 A1 * | 6/2019 | Gambee ............ | H01L 21/76885 |

* cited by examiner

*Primary Examiner* — Marcos D. Pizarro
*Assistant Examiner* — Tenley H Schofield
(74) *Attorney, Agent, or Firm* — MOSER TABOADA

(57) ABSTRACT

A method of depositing a metal material on an isolated seed layer uses a barrier layer as a conductive path for plating. The method may include depositing a barrier layer on a substrate wherein the barrier layer provides adhesion for seed layer material and inhibits migration of the seed layer material, forming at least one isolated seed layer area on the barrier layer on the substrate, and depositing the metal material on the at least one isolated seed layer area using an electrochemical deposition process wherein the barrier layer provides a current path to deposit the metal material on the at least one isolated seed layer area.

13 Claims, 5 Drawing Sheets

US 11,875,996 B2

METHODS FOR ELECTROCHEMICAL DEPOSITION OF ISOLATED SEED LAYER AREAS

FIELD

Embodiments of the present principles generally relate to semiconductor processing of semiconductor substrates.

BACKGROUND

Electrochemical deposition or plating is often used in semiconductor processing to form metal structures or layers. The substrate typically functions as a metal-based cathode. The substrate is submersed in a solution with an anode to plate various areas on the substrate that have exposed areas of a seed layer that attract metal ions when a current flows through the seed layer. The seed layer is generally a conformal layer that connects all of the exposed areas of the seed layer together. An area on the edge of the substrate may include an exposed area of the seed layer to allow for an electrical connection point to flow the current through the seed layer during plating. In order to control which areas of the seed layer are plated, a mask, such as a resist material, is patterned over the top of the seed layer on the substrate. Exposed areas of the seed layer are plated while areas covered by the resist are not. The inventors have observed, however, that the process then requires the resist to be removed after the plating process, slowing throughput.

Accordingly, the inventors have provided improved processes that eliminate post plating resist removal, increasing yields.

SUMMARY

Methods and apparatus for electrochemical deposition of isolated seed layer areas are provided herein.

In some embodiments, a method of depositing a metal material on a seed layer may comprise depositing a barrier layer on a substrate, wherein the barrier layer provides adhesion for a seed layer material and inhibits migration of the seed layer material, forming at least one isolated seed layer area on the barrier layer on the substrate, wherein the at least one isolated seed layer area is completely separated from any other portions of the seed layer, and depositing the metal material on the at least one isolated seed layer area using an electrochemical deposition process, wherein the barrier layer provides a current path to deposit the metal material on the at least one isolated seed layer area.

In some embodiments, the method may further include depositing the seed layer on the barrier layer and etching the seed layer to create at least one exposed portion of the barrier layer to form the at least one isolated seed layer area on the barrier layer, performing an oxygen-based descum process after etching the seed layer to oxidize the at least one exposed portion of the barrier layer to inhibit electrochemical deposition on the barrier layer, depositing the at least one isolated seed layer area using a printing process that forms seed layer material on the barrier layer, performing an oxygen-based descum process after depositing the at least one isolated seed layer area to inhibit electrochemical deposition on the barrier layer, wherein the barrier layer is a titanium-based material or a tungsten-based material and wherein the seed layer is a copper-based material, depositing the barrier layer as a conformal layer on the substrate, selectively depositing the seed layer only on horizontal surfaces of the substrate, depositing metal material on the substrate using the electrochemical deposition process, and performing a chemical mechanical polish to remove the barrier layer and seed layer from field surfaces of the substrate to form vias filled with columnar metal material, patterning resist on the seed layer to form an area for an isolated conductive pad, depositing the metal material on the area for the isolated conductive pad to form the seed layer on the barrier layer, removing the resist from the substrate to expose the barrier layer, depositing the metal material using the electrochemical deposition process to form the isolated conductive pad on the metal material of the seed layer, and selectively dry etching the substrate to remove exposed portions of the barrier layer from the substrate, forming the isolated conductive pad on the substrate, conformally depositing the barrier layer in a via on the substrate, forming the at least one isolated seed layer area on a bottom surface of the via, and depositing the metal material on the at least one isolated seed layer area in the via using the electrochemical deposition process to form columnar growth grain of the metal material in the via with a top-down view of a crystalline structure of the metal material having a 1-1-1 orientation, and/or forming a second via on a second substrate according to the method of claim 9 and bonding the second via on the second substrate to the via on the substrate of claim 9 using a hybrid bonding process, wherein the hybrid bonding process temperature is approximately 100 degrees to approximately 150 degrees.

In some embodiments, a method of depositing a copper material on a seed layer may comprise depositing a barrier layer of titanium material on a substrate, wherein the barrier layer provides adhesion for the seed layer and inhibits migration of the copper material, forming at least one isolated seed layer area on the barrier layer on the substrate, wherein the at least one isolated seed layer area is completely separated from any other portions of the seed layer, and depositing the copper material on the at least one isolated seed layer area using an electrochemical deposition process, wherein the barrier layer provides a current path to deposit the copper material on the at least one isolated seed layer area, depositing the seed layer on the barrier layer and etching the seed layer to create at least one exposed portion of the barrier layer to form the at least one isolated seed layer area on the barrier layer, performing an oxygen-based descum process after etching the seed layer to oxidize the at least one exposed portion of the barrier layer to inhibit electrochemical deposition on the barrier layer, depositing the at least one isolated seed layer area using a printing process that forms copper material on the barrier layer, depositing copper material on a bottom of a via to form the at least one isolated seed layer area and depositing the copper material on the bottom of the via using the electrochemical deposition process to fill the via with columnar growth copper material, depositing the barrier layer as a conformal layer on the substrate, selectively depositing the seed layer only on horizontal surfaces of the substrate, depositing copper on the substrate using the electrochemical deposition process, and performing a chemical mechanical polish to remove the barrier layer and seed layer from field surfaces of the substrate to form vias filled with columnar copper material, and/or patterning resist on the seed layer to form an area for an isolated conductive pad, depositing the copper material on the area for the isolated conductive pad to form the seed layer on the barrier layer, removing the resist from the substrate to expose the barrier layer, depositing the copper material using the electrochemical deposition process to form the isolated conductive pad on the copper material of the seed layer, and selectively dry etching the substrate to remove exposed portions of the barrier layer from the substrate, forming the isolated conductive pad on the substrate.

In some embodiments, a non-transitory, computer readable medium having instructions stored thereon that, when executed, cause a method of depositing a metal material on a seed layer to be performed, the method may comprise depositing a barrier layer on a substrate, wherein the barrier layer provides adhesion for a seed layer material and inhibits migration of the seed layer material, forming at least one isolated seed layer area on the barrier layer on the substrate, wherein the at least one isolated seed layer area is completely separated from any other portions of the seed layer, and depositing the metal material on the at least one isolated seed layer area using an electrochemical deposition process, wherein the barrier layer provides a current path to deposit the metal material on the at least one isolated seed layer area.

In some embodiments, the method on the non-transitory, computer readable medium may further include depositing the barrier layer as a conformal layer on the substrate, selectively depositing the seed layer only on horizontal surfaces of the substrate, depositing metal material on the substrate using the electrochemical deposition process, and performing a chemical mechanical polish to remove the barrier layer and seed layer from field surfaces of the substrate to form vias filled with columnar metal material, and/or patterning resist on the seed layer to form an area for an isolated conductive pad, depositing the metal material on the area for the isolated conductive pad to form the seed layer on the barrier layer, removing the resist from the substrate to expose the barrier layer, depositing the metal material using the electrochemical deposition process to form the isolated conductive pad on the metal material of the seed layer, and selectively dry etching the substrate to remove exposed portions of the barrier layer from the substrate, forming the isolated conductive pad on the substrate.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
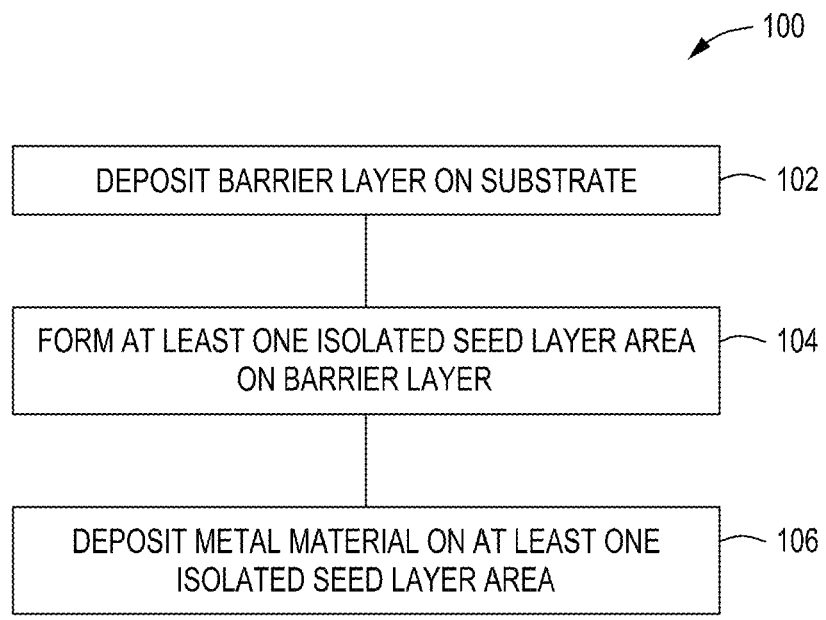
FIG. 1 is a method of electrochemically depositing metal material on isolated seed layer areas in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods herein provide high quality electrochemical deposition with a less complex process, enabling plating processes to be used in new applications. The methods of the present principles include selectively electroplating structures that are isolated areas of the seed layer. A number of applications can now make use of plating processes such as bottom up via filling and definition of plated structures by printed metal inks, among others. In bottom up via fill scenarios, the present methods allow the filling of a via selectively from the bottom even for damascene-like structures where sidewall seed layers can present grain structure challenges. Other processes enabled by the methods of the present principles include deposition of a patterned seed layer without resist by printing of conducting inks directly onto a refractory barrier layer. The newly enabled processes may have significant benefits in plating for solar cells, creating remote LED conductive pads, and hybrid bonding processes that reduce DRAM stack heights and the like while increasing resolution and conductivity.

In traditional processes, a conductive seed layer (e.g., Cu, Au, etc.) was accepted to be required for electroplating as the seed layer carries the current needed for plating. The barrier layer below the seed layer has higher resistance to current than the seed layer. The higher resistance of the barrier layer was thought by the industry to retard the plating growth and, thus, a seed layer with lower resistance was deemed necessary for high plating growth rates. However, the inventor has discovered that a barrier layer (e.g., Ti, Ta, etc.) is capable of conducting the current for plating without affecting the plating growth rate. The inventor has also found that due to insulating oxide layers on the refractory metals used in the barrier layer, the barrier layer presents a challenge when trying to plate directly onto the barrier layer. To overcome the plating shortcomings directly on the barrier layer, the inventor has discovered that an isolated island or isolated area of a seed layer may be used as the target area for electroplating. To form the isolated seed layer areas, in some embodiments, non-plated areas are left exposed using a patterned resist layer, and the non-plated areas of the seed layer are then removed, followed by the removal of the patterned resist layer and subsequent plating of the isolated seed layer areas. In some embodiments, the isolated seed layer areas are formed by using printable inks on the barrier layer.

In some embodiments, at wafer scale, for electrochemical deposition (ECD), a plating contact is made at the wafer edge through a seed layer. In traditional plating processes, the seed layer is normally continuous, and areas to be plated are made by patterning a resist layer on the seed layer. The inventor has found that with an edge contact formed from a seed layer, a wafer plating tool can also be used to plate onto isolated islands of seed layer areas across the wafer with high uniformity and at a plating rate similar to traditional processes. In some cases, the patterning of the seed layer by etching away seed layer material in areas that are not to be plated is more beneficial compared to using resist patterning. The methods disclosed herein have many benefits over traditional processes. When plating a grain-aligned copper film like nano-twin copper (NTC), plating onto a via sidewall seed confounds the columnar vertical orientation of the film. By effectively turning off the sidewall plating, the entire via can be filled with properly orientated grains by using the methods of the present principles. In the case of other patterning applications (like solar, LED, or coarse redistribution lines), by patterning before plating, either by printing or by doing a patterned etch of the seed layer before plating, no removal of unwanted plating material is required which eliminates the need to add and remove a patterned resist layer after plating.

In some processes such as hybrid bonding, the methods of the present principles may be used to enable low temperature bonding and reduced structure height. For hybrid bonding, the filling of a via by electrochemical deposition is normally accomplished by copper material forming on the bottom of the via and also on the sidewall of the via. NTC growth occurs at a direction normal to the seed surface, thus sidewall copper growth confounds the desired vertical structure (columnar growth). In some embodiments, by applying a PVD process deposited metal material to a via with a reentrant profile, the highly conformal barrier layer will coat the sidewalls while the highly directional copper layer will coat the top surface or field of the substrate and the bottom of the via but will be discontinuous on the sidewalls of the via, allowing columnar grain growth of the copper material within the via.

Figure 2:
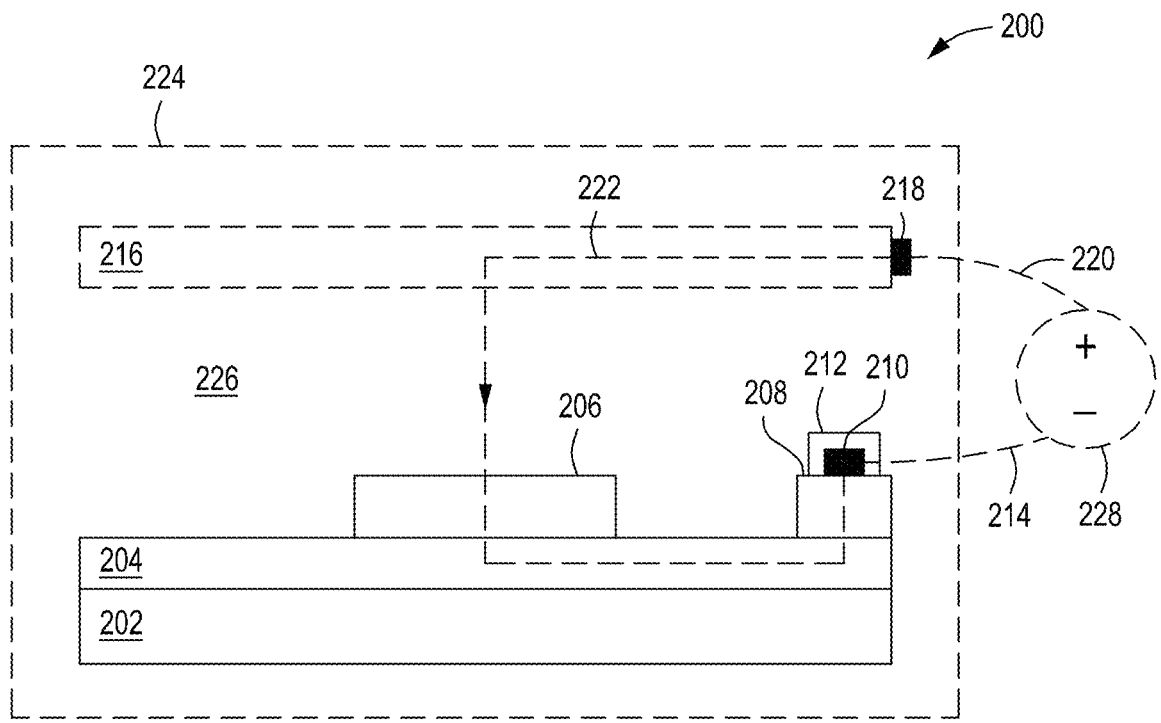
FIG. 2 depicts a cross-sectional view of isolated seed layer areas in context of an electrochemical deposition bath in accordance with some embodiments of the present principles.

FIG. 1 is a method 100 of electrochemically depositing metal material on isolated seed layer areas in accordance with some embodiments. In block 102, a barrier layer 204 is deposited on a substrate 202 as depicted in a view 200 of FIG. 2. Traditionally, the barrier layer 204 promotes adhesion of seed layer material and also serves to prevent migration of the seed layer material into the substrate 202 or other materials, such as dielectric materials, on the substrate 202. The dashed lines of FIG. 2 indicate the context in which the substrate 202 is placed during an ECD process in a horizontal orientation. The substrate 202 may also be positioned vertically during an ECD process. The anode 216 is typically part of the ECD system and is not usually inserted and removed with the substrate 202. In block 104, at least one isolated seed layer area 206 is formed on the barrier layer 204. As used herein, 'isolated' means that the seed layer area is separated or disconnected totally from any other seed layer material on the barrier layer 204. In essence, each isolated seed layer area forms an island of seed layer material on the barrier layer 204. A contact area 208 of seed layer material is formed in proximity of the edge of the substrate 202 to provide a contact point for connecting the substrate for an ECD process. An electrical contact point 210 is connected to the contact area 208 and encapsulated 212 or sealed to keep the contact area 208 dry during ECD processes. Variations on the formation of the at least one isolated seed layer area 206 are discussed below.

In block 106, metal material is deposited on the at least one isolated seed layer area 206 by an ECD process where the barrier layer 204 provides a current path for the electroplating of the at least one isolated seed layer area 206. The electrical contact point 210 is connected to a power supply 228 via a first connection 214. The power supply 228 is also connected to a second electrical contact point 218 of an anode 216 through a second connection 220. The substrate 202 and the anode 216 are then placed in a plating bath 224 filled with liquid 226 (e.g., copper sulphate, etc.). When the power supply 228 is activated, a current 222 flows through the anode 216 and the liquid 226 in the plating bath 224 to the at least one isolated seed layer area 206 to start the plating process. The current 222 then continues to flow through the at least one isolated seed layer area 206 and through the barrier layer 204 until the current 222 returns to the power supply 228 through the contact area 208 and the electrical contact point 210. The inventor has found that the ECD process using the more resistive barrier layer 204 as a current path instead of a continuous seed layer yields a deposition rate and uniform height of all isolated seed layer areas similar to using the seed layer as the current path but with the benefit of forming isolated plated areas without resist layer or plating material removal after plating.

Figure 3:
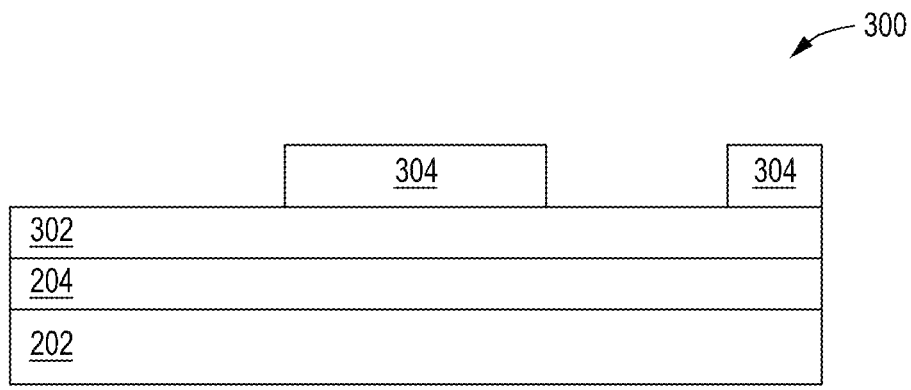
FIG. 3 depicts a cross-sectional view of a patterned resist layer on a seed layer in accordance with some embodiments of the present principles.
Figure 4:
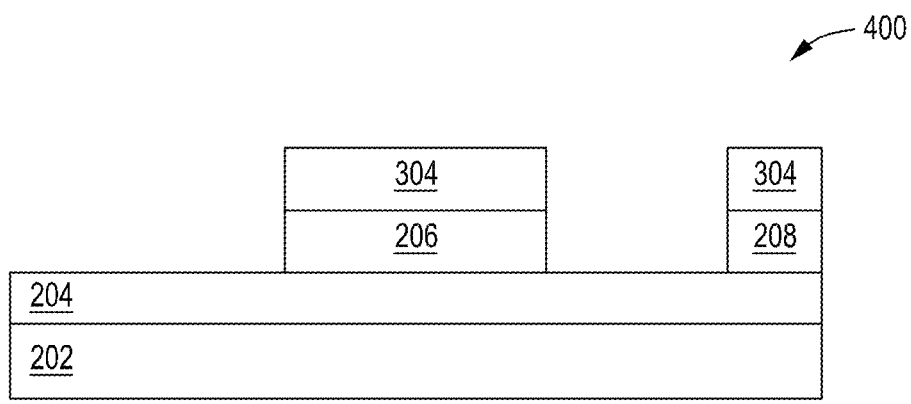
FIG. 4 depicts a cross-sectional view of a seed layer after etching in accordance with some embodiments of the present principles.
Figure 5:
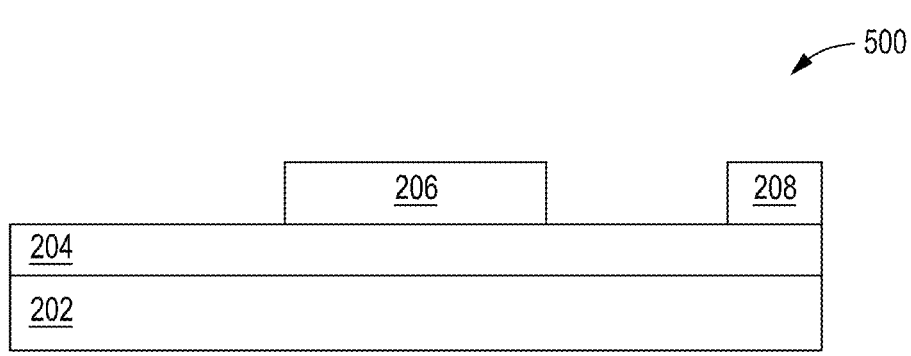
FIG. 5 depicts a cross-sectional view of an isolated seed layer area after removal of resist layer in accordance with some embodiments of the present principles.

FIG. 3 depicts a view 300 of a patterned resist layer 304 on a seed layer 302 in accordance with some embodiments. The following FIGS. 3-7 depict formation of at least one isolated seed layer area 206 and the contact area 208. In some embodiments, after the seed layer 302 is deposited on the barrier layer 204, the patterned resist layer 304 is formed on the seed layer 302. The patterned resist layer 304 covers or protects areas of the seed layer 302 where isolated seed layer areas are to be formed (areas to be plated). FIG. 4 depicts a view 400 of the seed layer 302 after etching through the patterned resist layer 304 and removing portions of the seed layer 302 to expose the barrier layer 204. Areas that are not to be plated have exposed areas of the barrier layer 204. Areas to be plated are protected by the patterned resist layer 304. FIG. 5 depicts a view 500 of the at least one isolated seed layer area 206 after removal of the patterned resist layer 304 in accordance with some embodiments.

Figure 6:
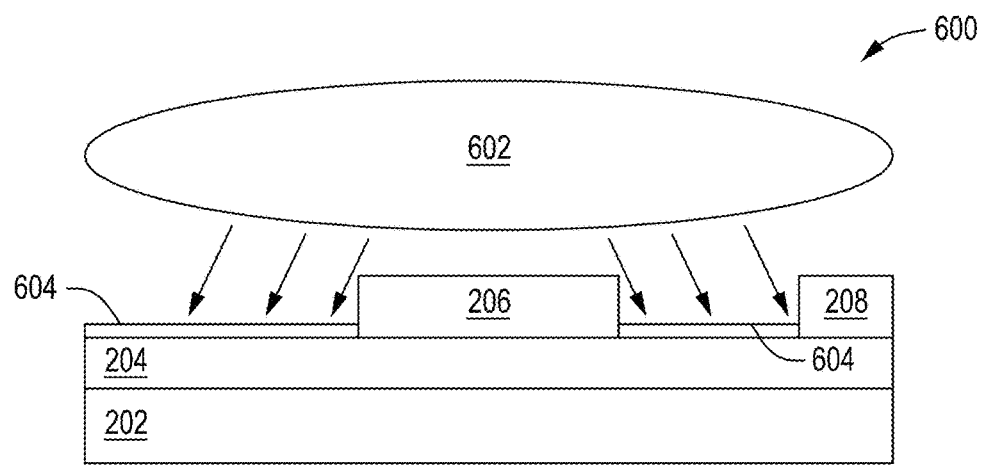
FIG. 6 depicts a cross-sectional view of a substrate undergoing an oxygen-based plasma treatment in accordance with some embodiments of the present principles.
Figure 7:
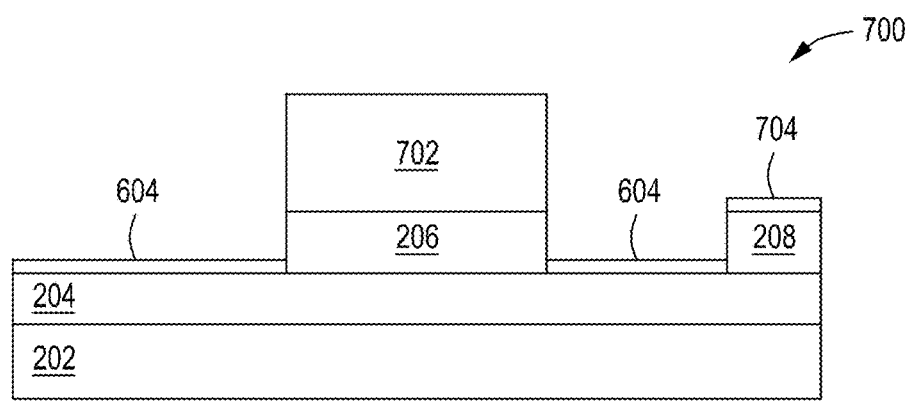
FIG. 7 depicts a cross-sectional view of a substrate after electrochemical deposition on an isolated seed layer area in accordance with some embodiments of the present principles.

FIG. 6 depicts a view 600 of the substrate 202 undergoing an optional oxygen-based plasma treatment in accordance with some embodiments. The barrier layer 204 begins to immediately oxidize at a fast rate, and the native oxidation buildup may be sufficient within a few hours to prevent plating of the barrier layer 204 without the treatment. In some embodiments, the optional oxygen-based plasma treatment may be used to speed up the oxidation buildup. Plasma 602 is formed using an oxygen-based process gas to provide oxygen to the surface of the barrier layer 204 to produce an oxidation layer 604 on the barrier layer 204. The oxygen-based plasma treatment may also be part of a descum process that also serves to remove organic material and other debris from the surfaces of the substrate 202. In some embodiments, the oxidation layer 604 is formed by exposure of the barrier layer 204 to the environment. FIG. 7 depicts a view 700 of the substrate 202 after an ECD process on the at least one isolated seed layer area 206 area in accordance with some embodiments. Prior to the plating process, a sealant 704 is formed on the contact area 208 to keep the contact area 208 dry. The ECD process forms a plating layer 702 on the at least one isolated seed layer area 206. No resist removal and unwanted plating removal is required after the plating as found in traditional ECD process flows.

Figure 8:
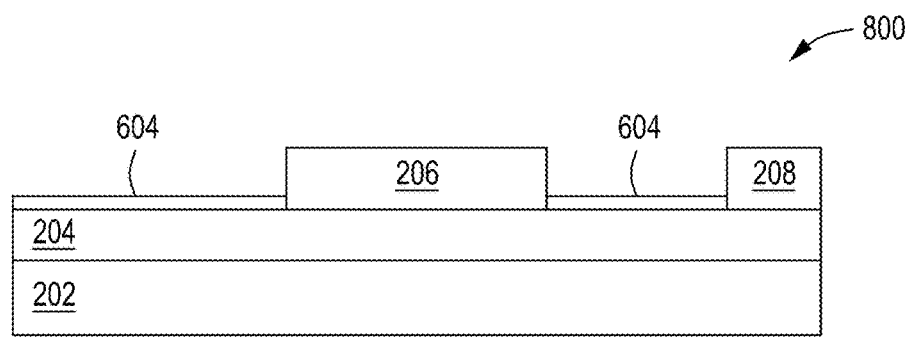
FIG. 8 depicts a cross-sectional view of a substrate with an isolated seed layer area formed by a printing process in accordance with some embodiments of the present principles.

FIG. 8 depicts a view 800 of the substrate 202 with the at least one isolated seed layer area 206 formed by a printing process. In some embodiments, after formation of the barrier layer 204, a printer may be used to deposit conductive metal ink directly onto the barrier layer 204. Some inks are formulated to produce the at least one isolated seed layer area 206 even when an oxidation layer 604 is present on the barrier layer 204. If the conductive ink is not able to print through the oxidation layer 604, the conductive ink may be applied directly on the barrier layer 204 after formation of the barrier layer 204 and before the barrier layer 204 begins to oxidize. In some embodiments, the deposition of the barrier layer 204 may be performed in an integrated tool under vacuum and the conductive ink printed while maintaining the vacuum to prevent oxidation on the barrier layer 204. The optional oxygen-based plasma treatment may be performed or the substrate 202 may be exposed to the environment after the printing process to produce the oxidation layer 604 on the barrier layer 204 to prevent plating during the ECD process.

Figure 9:
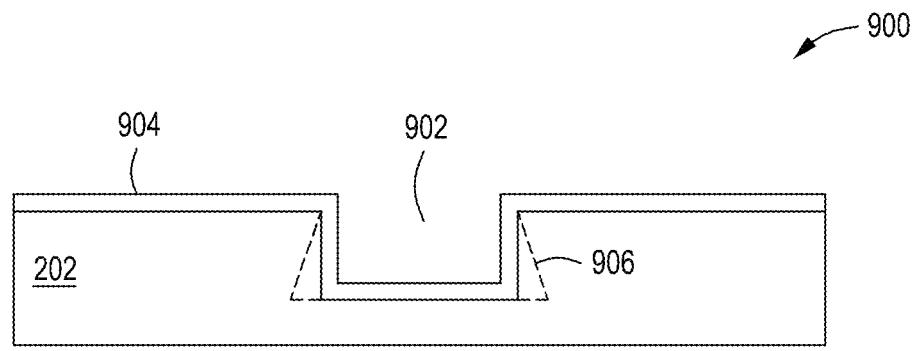
FIG. 9 depicts a cross-sectional view of a conformal barrier layer formed a substrate with a via in accordance with some embodiments of the present principles.
Figure 10:
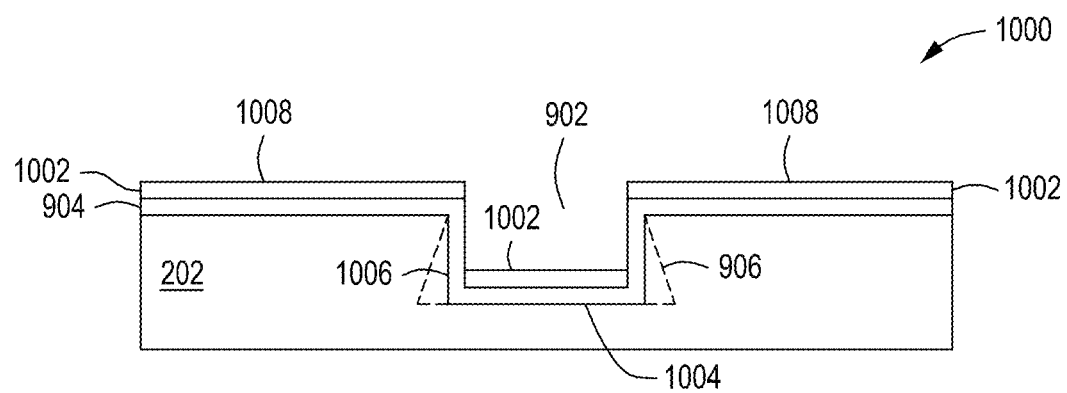
FIG. 10 depicts a cross-sectional view of a seed layer deposited on a substrate with a via in accordance with some embodiments of the present principles.

One of the many benefits of the methods of the present principles is the ability to form columnar grain growth in vias. FIGS. 9-12 depict the formation of a columnar grain growth via. FIG. 9 depicts a view 900 of a conformal barrier layer 904 formed the substrate 202 with a via 902 in accordance with some embodiments. Materials used in the conformal barrier layer 904 such as, for example but not limited to, titanium tend towards producing conformal layers. A titanium layer will produce a conformal layer even if an optional reentrant profile 906 is used for the via 902. FIG. 10 depicts a view 1000 of a seed layer 1002 deposited on the substrate 202 with the via 902 in accordance with some embodiments. Materials used in the seed layer 1002 such as, for example but not limited to, copper tend towards deposition on horizontal surfaces only such as on the uppermost surface 1008 or field of the substrate 202 and on a bottom surface 1004 of the via 902.

Figure 11:
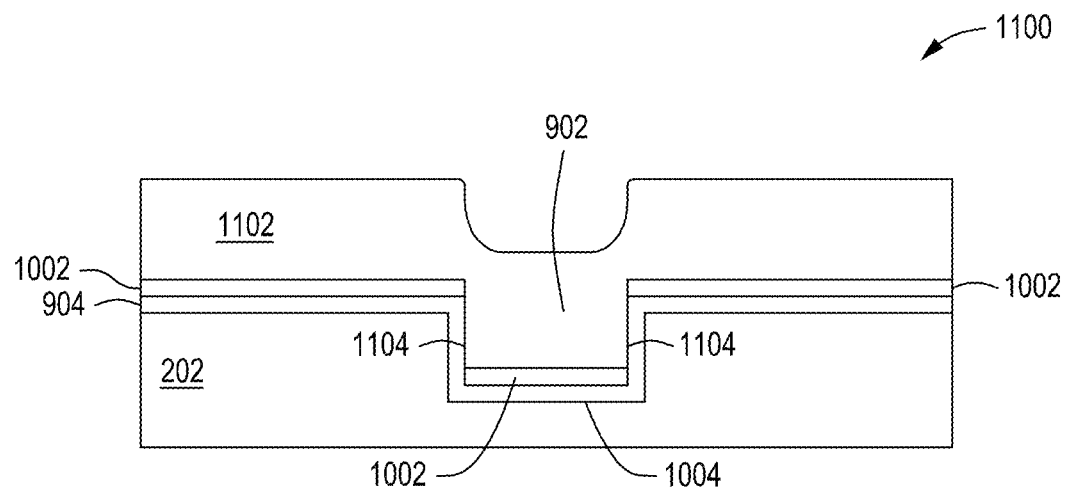
FIG. 11 depicts a cross-sectional view of columnar metal material formed by electrochemical deposition on a substrate with a via in accordance with some embodiments of the present principles.

The grain growth of the seed layer 1002, especially on the bottom surface 1004 will be columnar grain growth as the conformal barrier layer 904 on the sidewalls 1006 of the via 902 does not confound the grain growth of the seed layer 1002 like sidewalls that are covered with seed layer material. The horizontal surface deposition of the seed layer 1002 can be further enhanced by using the optional reentrant profile 906 for the via 902, as the narrower entrance further inhibits any vertical surface depositions of the seed layer 1002. FIG. 11 depicts a view 1100 of columnar metal material formed by an ECD process on the substrate 202 with the via 902 in accordance with some embodiments. As the material 1102 is plated onto the substrate 202, especially in the via 902, the grain growth from the seed layer 1002 on the bottom surface 1004 of the via 902 continues to grow in a columnar fashion throughout the entire via 902 and beyond.

Figure 12:
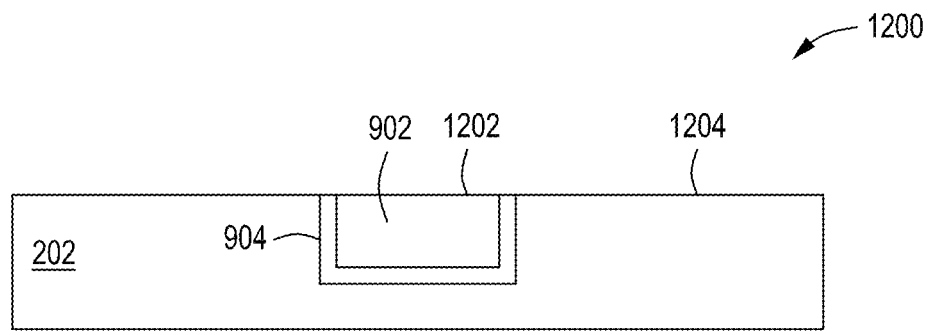
FIG. 12 depicts a cross-sectional view of columnar metal material formed in a via after a chemical mechanical polishing process in accordance with some embodiments of the present principles.

The vertical surfaces 1104 of the conformal barrier layer 904 in the via 902 do not confound the columnar grain growth as would a surface coated with a seed layer material and the like, enabling the desired grain growth pattern. FIG. 12 depicts a view 1200 of columnar grain growth metal material 1202 formed in the via 902 after a chemical mechanical polishing (CMP) process in accordance with some embodiments. After the plating process is completed, the overburden on the substrate 202 may be removed using the CMP process to reveal the via 902 on the surface 1204 of the substrate 202. A similar process may be used for interconnect lines, trenches, dual damascene structures, and the like. The CMP process occurs during traditional processing of substrates, allowing the methods to be easily incorporated into existing workflows to produce columnar grain growth-based interconnect structures and the like.

Figure 13:
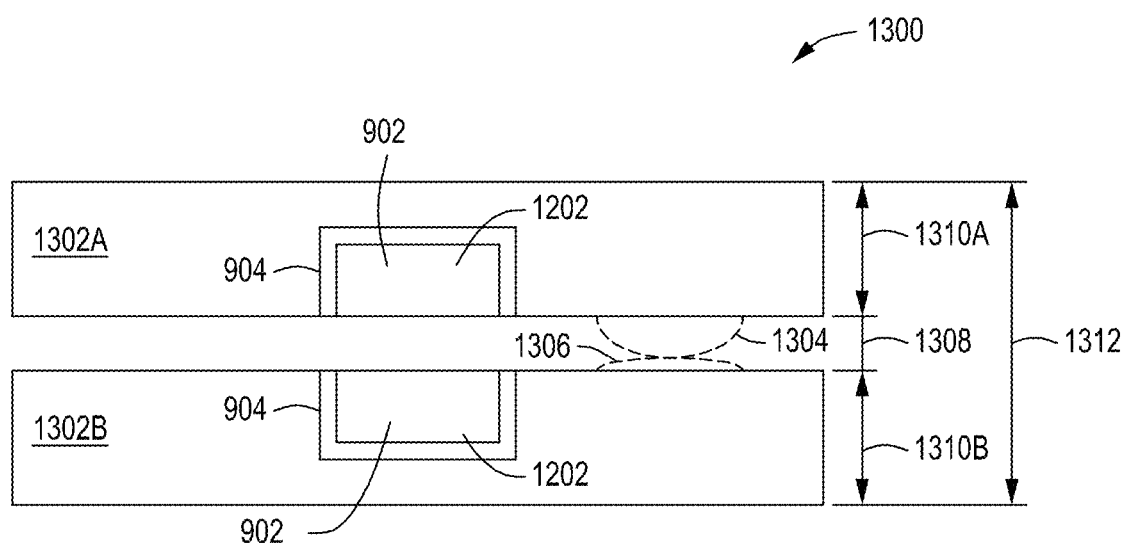
FIG. 13 depicts a cross-sectional view of a hybrid bonding process for DRAM stacks in accordance with some embodiments of the present principles.

FIG. 13 depicts a view 1300 of a hybrid bonding process for dynamic random-access memory (DRAM) stacks in accordance with some embodiments. Although, for the sake of brevity, the hybrid bonding process example uses DRAM stacks and copper materials, other structures and materials may use the methods of the present principles for bonding purposes as well. Columnar grain growth materials, such as the vias and interconnects disclosed herein, have unique characteristics that make the materials valuable for hybrid bonding. The columnar grain growth when viewed from above has 1-1-1 aligned grains in the crystalline structure. In the case of copper materials, 1-1-1 aligned copper is also known as nano twin copper (NTC). The 1-1-1 aligned copper produces the densest copper of any orientation of a copper crystalline structure, yielding the highest density of copper atoms per area. The advantage of such density is that when two surfaces meet, the diffusivity of the interface is approximately 100 times higher than the diffusivity of randomly oriented copper. The advantage of high diffusivity of an interface is that the surfaces create a copper-to-copper bond at a significantly lower temperature. Traditional techniques using poly-crystalline copper require a bonding temperature of 350 degrees Celsius or more. The high temperature makes using poly-crystalline copper connections untenable for bonding purposes of devices with low thermal budges such as DRAM. DRAM, in general, cannot be subjected to temperatures above 200 degrees Celsius. With 1-1-1 oriented copper structures, hybrid bonding of the structures can occur at temperatures between approximately 100 degrees Celsius and approximately 150 degrees Celsius, enabling the hybrid bonding process for low thermal budget structures such as DRAM and the like.

Another advantage of the methods of the present principles is reduced stack heights. Although DRAM stacks are used as an example, other structures may benefit from the present techniques as well. In FIG. 13, a first DRAM stack 1302A is to be stacked or bonded to a second DRAM stack 1302B. In traditional processes, a copper-nickel-tin-silver bump 1304 is formed on one of the stacks and a gold pad 1306 is formed on the other stack. When the two stacks are joined, the stacks will have a standoff height 1308 equal to the heights of the copper-nickel-tin-silver bump 1304 and the gold pad 1306. The standoff height 1308 may be on the order of up to 15 or 20 microns. As the DRAM stack heights 1310A, 1310B may be on the order of 30 to 50 microns, the standoff height 1308 adds a significant amount to the overall stack height 1312. With the techniques of the present principles, the standoff height 1308 is effectively removed from the equation (approximately zero), greatly increasing the number of DRAM stacks that can be formed in a given space while increasing the conductivity of the connections with a denser more homogeneous connection. In addition, due to the increased density of the material provided by the methods of the present principles, smaller connections with the same current carrying capacity can be formed as the connection materials with the 1-1-1 columnar grain orientation are denser, allowing for increased package density.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method of depositing a metal material on a seed layer, comprising:
depositing a barrier layer on a substrate, wherein the barrier layer provides adhesion for a seed layer material and inhibits migration of the seed layer material;
depositing the seed layer on the barrier layer;
etching the seed layer to create at least one exposed portion of the barrier layer and form at least one isolated seed layer area on the barrier layer,
wherein the at least one isolated seed layer area is completely separated from any other portions of the seed layer;
performing an oxygen-based descum process after etching the seed layer to oxidize the at least one exposed portion of the barrier layer to inhibit electrochemical deposition on the barrier layer; and
depositing the metal material on the at least one isolated seed layer area using an electrochemical deposition process, wherein the barrier layer provides a current path to deposit the metal material on the at least one isolated seed layer area.

2. The method of claim 1, wherein the barrier layer is a titanium-based material or a tungsten-based material and wherein the seed layer is a copper-based material.

3. The method of claim 1, further comprising:
depositing the barrier layer as a conformal layer on the substrate;
selectively depositing the seed layer only on horizontal surfaces of the substrate;
depositing metal material on the substrate using the electrochemical deposition process; and
performing a chemical mechanical polish to remove the barrier layer and seed layer from field surfaces of the substrate to form vias filled with columnar metal material.

4. The method of claim 1, further comprising:
patterning resist on the seed layer to form an area for an isolated conductive pad;
depositing the metal material on the area for the isolated conductive pad to form the seed layer on the barrier layer;
removing the resist from the substrate to expose the barrier layer;
depositing the metal material using the electrochemical deposition process to form the isolated conductive pad on the metal material of the seed layer; and
selectively dry etching the substrate to remove exposed portions of the barrier layer from the substrate, forming the isolated conductive pad on the substrate.

5. The method of claim 1, further comprising:
conformally depositing the barrier layer in a via on the substrate;
forming the at least one isolated seed layer area on a bottom surface of the via; and
depositing the metal material on the at least one isolated seed layer area in the via using the electrochemical deposition process to form columnar growth grain of the metal material in the via with a top-down view of a crystalline structure of the metal material having a 1-1-1 orientation.

6. The method of claim 5, further comprising:
forming a second via on a second substrate according to the method of claim 5; and
bonding the second via on the second substrate to the via on the substrate of claim 5 using a hybrid bonding process, wherein the hybrid bonding process temperature is approximately 100 degrees to approximately 150 degrees.

7. A method of depositing a copper material on a seed layer, comprising:
depositing a barrier layer of titanium material on a substrate, wherein the barrier layer provides adhesion for the seed layer and inhibits migration of the copper material;
forming at least one isolated seed layer area on the barrier layer on the substrate, wherein the at least one isolated seed layer area is completely separated from any other portions of the seed layer, and wherein the at least one isolated seed layer is formed by depositing the seed layer on the barrier layer and etching the seed layer to create at least one exposed portion of the barrier layer;
performing an oxygen-based descum process after etching the seed layer to oxidize the at least one exposed portion of the barrier layer to inhibit electrochemical deposition on the barrier layer; and
depositing the copper material on the at least one isolated seed layer area using an electrochemical deposition process, wherein the barrier layer provides a current path to deposit the copper material on the at least one isolated seed layer area.

8. The method of claim 7, further comprising:
depositing copper material on a bottom of a via to form the at least one isolated seed layer area; and
depositing the copper material on the bottom of the via using the electrochemical deposition process to fill the via with columnar growth copper material.

9. The method of claim 7, further comprising:
depositing the barrier layer as a conformal layer on the substrate;
selectively depositing the seed layer only on horizontal surfaces of the substrate;
depositing copper on the substrate using the electrochemical deposition process; and
performing a chemical mechanical polish to remove the barrier layer and seed layer from field surfaces of the substrate to form vias filled with columnar copper material.

10. The method of claim 7, further comprising:
patterning resist on the seed layer to form an area for an isolated conductive pad;
depositing the copper material on the area for the isolated conductive pad to form the seed layer on the barrier layer;
removing the resist from the substrate to expose the barrier layer;
depositing the copper material using the electrochemical deposition process to form the isolated conductive pad on the copper material of the seed layer; and
selectively dry etching the substrate to remove exposed portions of the barrier layer from the substrate, forming the isolated conductive pad on the substrate.

11. A non-transitory, computer readable medium having instructions stored thereon that, when executed, cause a method of depositing a metal material on a seed layer to be performed, the method comprising:
depositing a barrier layer on a substrate, wherein the barrier layer provides adhesion for a seed layer material and inhibits migration of the seed layer material;
depositing the seed layer on the barrier layer;
etching the seed layer to create at least one exposed portion of the barrier layer and form at least one isolated seed layer area on the barrier layer, wherein the at least one isolated seed layer area is completely separated from any other portions of the seed layer;
performing an oxygen-based descum process after etching the seed layer to oxidize the at least one exposed portion of the barrier layer to inhibit electrochemical deposition on the barrier layer; and
depositing the metal material on the at least one isolated seed layer area using an electrochemical deposition process, wherein the barrier layer provides a current path to deposit the metal material on the at least one isolated seed layer area.

12. The non-transitory, computer readable medium of claim 11, the method further comprising:
depositing the barrier layer as a conformal layer on the substrate;
selectively depositing the seed layer only on horizontal surfaces of the substrate;
depositing metal material on the substrate using the electrochemical deposition process; and
performing a chemical mechanical polish to remove the barrier layer and seed layer from field surfaces of the substrate to form vias filled with columnar metal material.

13. The non-transitory, computer readable medium of claim 11, the method further comprising:
patterning resist on the seed layer to form an area for an isolated conductive pad;
depositing the metal material on the area for the isolated conductive pad to form the seed layer on the barrier layer;
removing the resist from the substrate to expose the barrier layer;
depositing the metal material using the electrochemical deposition process to form the isolated conductive pad on the metal material of the seed layer; and
selectively dry etching the substrate to remove exposed portions of the barrier layer from the substrate, forming the isolated conductive pad on the substrate.

* * * * *